United States Patent
Smith et al.

(10) Patent No.: US 7,994,069 B2
(45) Date of Patent: Aug. 9, 2011

(54) SEMICONDUCTOR WAFER WITH LOW-K DIELECTRIC LAYER AND PROCESS FOR FABRICATION THEREOF

(75) Inventors: Brad Smith, Gieres (FR); Cindy Goldberg, Montobonnot (FR); Robert E. Jones, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 34 days.

(21) Appl. No.: 11/910,054

(22) PCT Filed: Mar. 31, 2005

(86) PCT No.: PCT/EP2005/004649
§ 371 (c)(1),
(2), (4) Date: Sep. 28, 2007

(87) PCT Pub. No.: WO2006/102926
PCT Pub. Date: Oct. 5, 2006

(65) Prior Publication Data
US 2008/0182379 A1    Jul. 31, 2008

(51) Int. Cl.
*H01L 21/31*    (2006.01)
(52) U.S. Cl. ........ 438/778; 438/637; 438/780; 438/790; 438/795; 257/40; 257/E21.581
(58) Field of Classification Search .................. 438/637, 438/778, 780, 781, 790, 795; 257/40, E21.581
See application file for complete search history.

(56) References Cited

U.S. PATENT DOCUMENTS

| | | | |
|---|---|---|---|
| 5,858,871 A | 1/1999 | Jeng | |
| 6,475,930 B1 | 11/2002 | Junker et al. | |
| 6,756,085 B2 | 6/2004 | Waldfried et al. | |
| 2001/0038889 A1 | 11/2001 | Pangrle et al. | |
| 2002/0106500 A1 | 8/2002 | Albano et al. | |
| 2003/0054115 A1 | 3/2003 | Albano et al. | |
| 2003/0199132 A1 | 10/2003 | Chen et al. | |
| 2004/0018319 A1 | 1/2004 | Waldfried et al. | |
| 2004/0058090 A1 | 3/2004 | Waldfried et al. | |
| 2004/0096593 A1 | 5/2004 | Lukas et al. | |
| 2004/0096672 A1 | 5/2004 | Lukas et al. | |
| 2004/0213986 A1 | 10/2004 | Kim et al. | |
| 2004/0214110 A1* | 10/2004 | Kim et al. | 430/311 |
| 2004/0251549 A1* | 12/2004 | Huang et al. | 257/758 |
| 2005/0040534 A1 | 2/2005 | Farnworth et al. | |
| 2005/0133920 A1* | 6/2005 | Liou et al. | 257/758 |

(Continued)

FOREIGN PATENT DOCUMENTS

EP    1457583 A2    9/2004

(Continued)

*Primary Examiner* — Matthew Smith
*Assistant Examiner* — Su C Kim

(57) ABSTRACT

To improve the mechanical strength of a wafer comprising a low-k dielectric layer, the low-k dielectric layer is formed so as to have certain regions of low dielectric constant and the remainder having a higher mechanical strength. The higher-strength regions may have a relatively-higher value of dielectric constant. Selective ultraviolet curing of a dielectric material can be performed so as to expel a porogen from the region(s) desired to have low dielectric constant. A photomask, hardmask, or opaque resist, patterned so as to define the region(s) to have lower dielectric constant, is used to shield the remainder of the dielectric material from the ultraviolet radiation. Alternatively, a layer of dielectric material can be blanket cured to lower its dielectric constant, then non-critical regions thereof can be selectively over-cured whereby to produce regions of increased mechanical strength.

8 Claims, 3 Drawing Sheets

U.S. PATENT DOCUMENTS

| | | | |
|---|---|---|---|
| 2005/0156288 A1* | 7/2005 | Goodner | 257/659 |
| 2005/0242440 A1* | 11/2005 | Owada et al. | 257/758 |
| 2006/0040498 A1* | 2/2006 | Yang et al. | 438/687 |
| 2008/0122109 A1* | 5/2008 | Yang et al. | 257/774 |

FOREIGN PATENT DOCUMENTS

| | | | |
|---|---|---|---|
| EP | 1122333 B1 | 12/2006 |
| JP | 05055405 | 3/1993 |
| WO | 9967794 A1 | 12/1999 |
| WO | 03025993 A1 | 3/2003 |
| WO | 03025994 A1 | 3/2003 |
| WO | 03085058 A1 | 10/2003 |
| WO | 2005062348 A1 | 7/2005 |

* cited by examiner

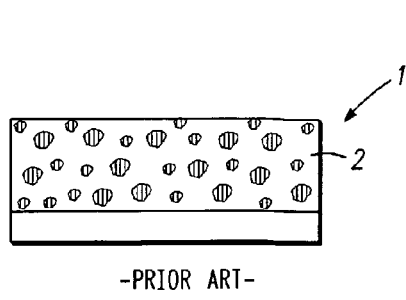
FIG. 1A -PRIOR ART-
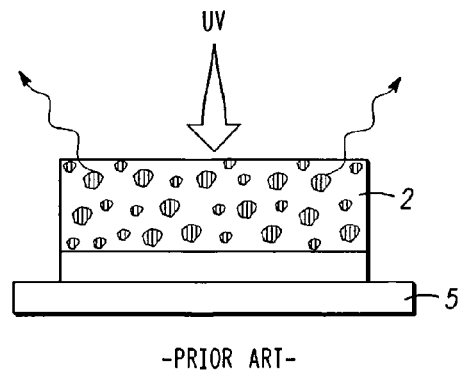
FIG. 1B -PRIOR ART-
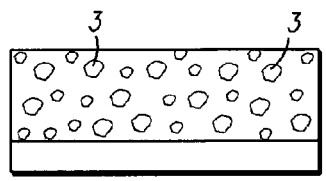
FIG. 1C -PRIOR ART-
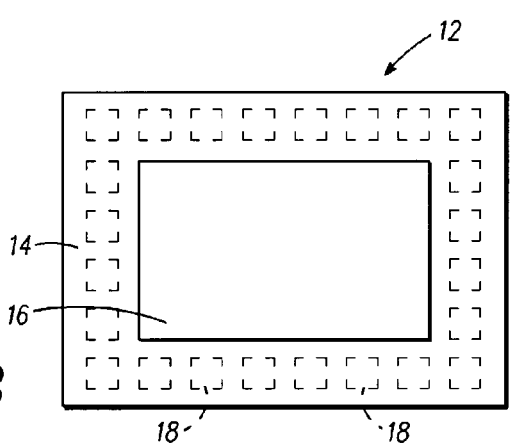
FIG. 3
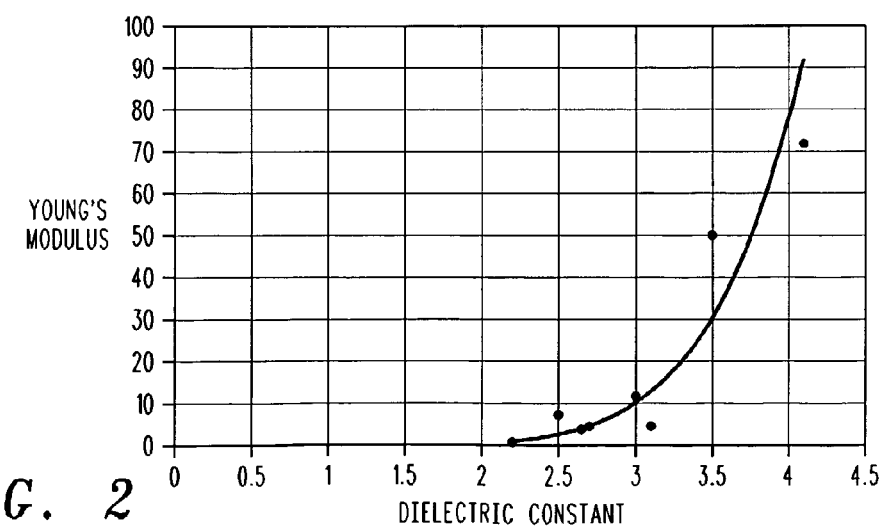
FIG. 2

SEMICONDUCTOR WAFER WITH LOW-K DIELECTRIC LAYER AND PROCESS FOR FABRICATION THEREOF

FIELD OF THE INVENTION

The present invention relates to the fabrication of a semiconductor wafer including a dielectric layer having a low dielectric constant layer (a low-k or ultra-low-k dielectric layer) and to a semiconductor wafer resulting from the fabrication process.

BACKGROUND OF THE INVENTION

As integrated circuit devices become increasingly highly-integrated, and patterned features descend to 65 nm and beyond, it is becoming increasingly desirable to form low-k (dielectric constant k<3.0) or ultra-low-k (dielectric constant $\leq 2.5$) dielectric layers on a semiconductor wafer, for example as an interlayer dielectric between different layers of metallization, in order to attain desired capacitance values. (To simplify, in the present document the expression "low-k dielectric" is intended to cover both low-k and ultra-low-k dielectrics, unless the context indicates otherwise).

In order to produce a dielectric layer having a suitably low dielectric constant, it is known to introduce small pores (typically the size of one or several nanometers) into a material which already has a low dielectric constant, such as poly (methylsilsesquioxane), p-MSQ. As a first step, a film is created which is an inorganic matrix of p-MSQ containing a porogen, such as acrylate. Then, in a second step, the porogen is expelled, leaving a nanoporous film having a low dielectric constant. The same type of two-step process is used for producing mesoporous or nanoporous low-k dielectric layers of other materials.

Different techniques have been proposed for expelling the porogen in order to produce the desired low-k dielectric layer. Initial proposals involved applying heat to the semiconductor wafer, in a thermal annealing step. However, the elevated temperatures required for thermal annealing, and the duration of the heating periods, often produced undesirable effects on other components of integrated circuit devices being formed on the wafer (e.g. on Cu metal lines already present on the wafer). Accordingly, other proposals have suggested that the initial non-porous layer of dielectric material could be rendered porous by curing it, notably by application of ultraviolet radiation (UV). This approach is illustrated schematically in FIG. 1, in which the thickness of the dielectric layer is greatly exaggerated compared to the thickness of the other wafer layers. The UV curing step generally involves heating the semiconductor wafer, but for a much shorter time than would be necessary for a thermal annealing process alone (e.g. 1/20 of the time needed for thermal annealing).

As illustrated in FIG. 1A, a layer 2 of dielectric material is formed on a wafer 1. This layer 2 consists of a matrix having distributed within it a pore-generating material (porogen). The wafer 1 is placed on a chuck 5 which is heated while UV radiation is applied to the layer of dielectric material 2 (see FIG. 1B). As UV curing takes place, the porogen is expelled from the layer of dielectric material 2, as indicated by the curved arrows in FIG. 1B. After UV curing, the dielectric material has tiny voids, or pores, 3 distributed throughout it, as indicated in FIG. 1C. As a result, the dielectric layer 2 now has a reduced value of dielectric constant Different materials have been proposed for use in forming porous low-k dielectric layers on a semiconductor wafer. However, the porosity of the low-k dielectric material generally results in low mechanical strength (generally a Young's modulus value of much less than 10 GPa, and low hardness) compared with traditional $SiO_2$ dielectric layers which are relatively tough (having Young's modulus in the range of around 46 to 92 GPa, depending upon the technique used for formation of the $SiO_2$ layer). In the case of methylsilsesquioxane (MSQ), the expulsion of porogens (in order to achieve low-k) reduces the mechanical strength from around 14 GPa to below 6 GPa. In the case of the MSQ-based material Zirkon™ LK2000, produced by RHEM, the expulsion of porogens reduces the mechanical strength from around 10 GPa to around 5 GPa.

When examining the properties of low-k dielectric materials a correlation has been found between lower dielectric constant and reduced Young's modulus. This effect is illustrated in the graph of FIG. 2.

Moreover, this problem of low mechanical strength affects layers made of various low-k dielectric materials. It is especially acute for spin-on deposited dielectric materials, because of a relatively lower degree of cross-linking than CVD deposited films. Organic polymers, in particular, have low mechanical stability.

It is believed that a Young's modulus of at least 6 GPa is required in order for a layer of material to withstand integration into conventional fabrication processes. In fact, the low-k dielectric material can often have such low mechanical strength that it becomes impossible to apply subsequent process steps, notably conventional packaging steps, or even copper chemical mechanical planarization (CMP). Typically, the low-k dielectric layer may peel off during Cu CMP, or crack during packaging. Accordingly, such low-k dielectric materials can only be used if special techniques are employed for the subsequent processing steps, which increase the cost and complexity of the manufacturing process.

It is desirable to be able to produce a low-k dielectric layer on a semiconductor wafer while ensuring that this layer maintains a sufficient degree of mechanical strength to enable it to withstand subsequent conventional process stages.

The present invention provides a fabrication method for fabricating a semiconductor wafer comprising a low-k dielectric layer, in accordance with the appended claims.

The present invention further provides a semiconductor wafer comprising a low-k dielectric layer, in accordance with the appended claims.

Certain presently-preferred embodiments of the invention will now be described, by way of example, with reference to the drawings, of which:

BRIEF DESCRIPTION OF THE DRAWINGS

FIG. 1 illustrates a prior art technique for reducing the dielectric constant of a dielectric layer provided on a semiconductor wafer, in which:

FIG. 1A illustrates schematically the structure of the dielectric layer as deposited on the wafer, FIG. 1B illustrates a process for UV curing the dielectric layer of FIG. 1A, and FIG. 1C illustrates schematically, the structure of the dielectric layer after UV curing;

FIG. 2 is a graph showing dielectric constant and Young's modulus values for certain low-k dielectric materials;

FIG. 3 illustrates one example of a selection of portions of a dielectric layer for UV cure according to the methods of the preferred embodiments of the invention;

FIG. 9 illustrates another method of selective processing of a dielectric layer, according to a fourth preferred embodiment of the present invention, in which

DETAILED DESCRIPTION OF THE PREFERRED EMBODIMENTS

Figure 4:
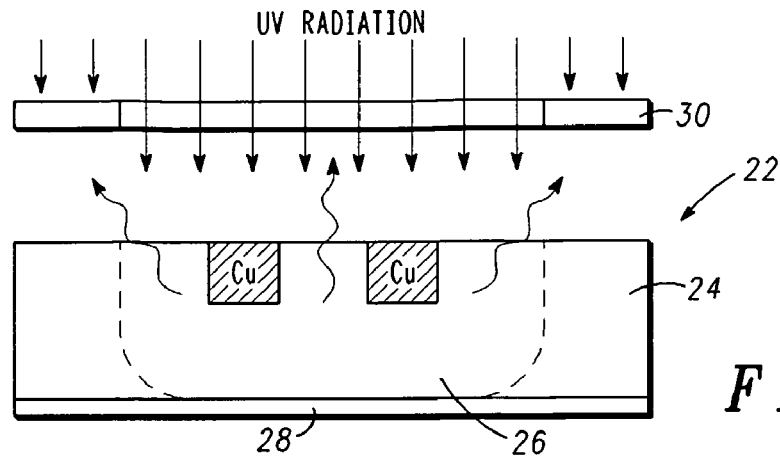
FIG. 4 illustrates a method of selective UV curing of a dielectric layer, according to a first preferred embodiment of the present invention.

The present inventor has realized that when a low-k dielectric layer is formed on a semiconductor layer there will generally be parts of the dielectric layer where it is not critical to have an especially low value of the dielectric constant. Accordingly, it is permissible to form the dielectric layer so that only certain portions have low-k and other, non-critical, portions of the dielectric layer have relatively higher values for dielectric constant.

In cases where the low-k dielectric portions are porous (or otherwise have low mechanical strength), reducing the amount of the dielectric layer which is rendered low-k can, in suitable materials, increase the mechanical strength of the finished dielectric layer. This improves the overall mechanical strength of the semiconductor wafer and can enable it to undergo the robust processing involved in conventional packaging and CMP processes.

Accordingly, a first aspect of the present invention involves fabrication of a semiconductor wafer comprising a dielectric layer having selected portions of reduced dielectric constant whereas the remainder of the dielectric layer has a relatively greater value of dielectric constant.

FIG. 3 is a diagram illustrating one example of a possible selection of portions of the dielectric layer to be treated so as to have low dielectric constant. More particularly, FIG. 3 shows a portion 12 of a wafer that corresponds to an integrated circuit device. The integrated circuit device has a number of bonding pads 18 (generally corresponding to input/output terminals). In this example, it is desired to produce a dielectric layer on this wafer portion 12 such that a central region 16 of the dielectric layer has a low dielectric constant, whereas a peripheral region 14 of the dielectric layer has a relatively higher dielectric constant. This peripheral region 14 of the dielectric layer corresponds to the location of the bonding pads 18.

Because the central region 16 of the dielectric layer is treated to lower its dielectric constant, it enables a desired drop in capacitance to be achieved in an area of the circuit device where this is required.

Because the peripheral region 14 of the dielectric layer is not treated so as to lower its dielectric constant, it remains substantially as deposited and, in suitable materials, has greater mechanical strength than the low-k region 16. For many dielectric materials, this now makes it possible to apply conventional CMP and packaging process steps to the wafer bearing the dielectric layer.

In general, the packaging steps in a semiconductor device fabrication process require greater mechanical strength of the wafer than is required for CMP process steps. Thus, certain low-k dielectric materials, once treated so as to attain their low-k value, can withstand CMP but cannot withstand packaging. In such a case, one simple solution is to maintain the dielectric constant of the portions of the dielectric layer corresponding to the bonding pads, as in the example illustrated in FIG. 3, while reducing the dielectric constant only of the central portion 16.

Other low-k dielectric materials have such low mechanical strength once they have been treated to attain their low-k value that they cannot withstand either packaging or polishing. In such cases, it may be necessary to maintain the dielectric constant over a larger, or different, area of the dielectric layer compared with the example of FIG. 3. In general, in order to achieve the degree of mechanical strength required to enable the wafer to withstand CMP, a choice is necessary as to the physical extent and the precise location of the regions whose dielectric constant will be maintained and those whose dielectric constant will be lowered.

The choice of regions to have lowered-k must, of course, take into account the locations of the circuit elements for which it is critical that there should be a low-k value for the dielectric layer (in order to achieve a sufficiently low capacitance). For example, it is common practice to use low-Vt/high-leakage transistors in critical speed paths of an integrated circuit device, so as to increase overall circuit speed. In such a case, it would be appropriate to lower the dielectric constant of the dielectric layer in regions corresponding to critical speed paths to create the same effect. In general, it will be desirable to produce lowered-k regions of the dielectric layer at locations where it is desired to improve circuit performance or to lower power consumption.

In view of the above, the skilled person will readily appreciate that his selection of region(s) to have reduced k is not limited to the selection illustrated in FIG. 3; the selection will take into account circuit design as well as the mechanical properties of the dielectric material he has chosen. In practice, it will often be the case that the selected regions will be small areas distributed over the whole surface of the die.

According to the first aspect of the present invention, a technique such as selective UV curing is used so as to render the selected region(s) of a dielectric layer low-k and to maintain the initial (as deposited) dielectric constant of the remainder of the dielectric layer.

Three presently-preferred embodiments according to the first aspect of the present invention will now be described with reference to FIGS. 4 to 8. FIGS. 4 to 8 are simplified diagrams, only showing a few of the layers present on a wafer during fabrication of integrated circuit devices and only showing a limited region on the wafer.

In the following description it is assumed that a layer of dielectric material has already been deposited on the wafer by a process appropriate to the selected dielectric material (e.g. by chemical vapour deposition (CVD), plasma-assisted CVD, spin coating, etc.) and the as-deposited dielectric material has a suitable mechanical strength to withstand conventional polishing and packaging process steps.

Moreover, in the following description it is assumed that a number of copper lines (Cu) have been formed in the dielectric layer and that Cu CMP has already taken place before UV curing of the dielectric to expel the porogen. In such a case it is preferable that the dielectric material should not undergo significant shrinkage during UV curing. However, it is to be understood that the present invention is not limited to the case where the selective UV curing of the dielectric layer occurs after Cu CMP, the selective curing step could be performed before the CMP step.

A first preferred embodiment of the invention is illustrated in FIG. 4 and relates to the selective UV curing of a dielectric layer 22. Typically, this dielectric layer 22 will be formed on a passivation layer 28 made of a suitable material, e.g. nitride (such as SiN or, more probably SiCN), SiC, etc.

In this first preferred embodiment, a photomask 30, but no resist, is used to select which regions of a dielectric layer 22 will be irradiated. As illustrated in FIG. 4, the photomask is patterned so that a specific region 26 of the dielectric layer 22 is exposed to ultraviolet radiation, whereas a remaining region 24 thereof is shielded from the UV radiation. When UV radiation is applied to the selected region 26 of the dielectric layer 22, porogens in the dielectric material are expelled, as illustrated by the curved arrows in FIG. 4.

While the UV radiation is being selectively applied to the dielectric layer 22, the whole wafer is also heated, typically by heating the chuck supporting the wafer (as in conventional methods for expelling porogens). As an example, the wafer may be held at a temperature of the order of 400° C., for a period of the order of 10 minutes.

The photomask used in the first preferred embodiment of the invention can be patterned using conventional techniques. The photomask itself is liable to be some distance away from the wafer and so is unlikely to be affected by the expelled porogen. However, if conventional high-resolution stepper apparatus is used for the UV exposure process, then the stepper lens would be within a few millimeters of the wafer surface and so would become coated with the expelled porogen.

It is preferable to adopt measures to prevent the expelled porogens from producing adverse effects on the exposure apparatus. For example, one possible approach would be to use a special exposure tool having a greater working distance (this is permissible because a high resolution is not generally required for defining the regions to be selectively UV cured). Another possible approach is to place gas exhausts near the wafer surface. It could also be envisaged to use immersion photolithography during the selective UV cure process.

Figure 5:
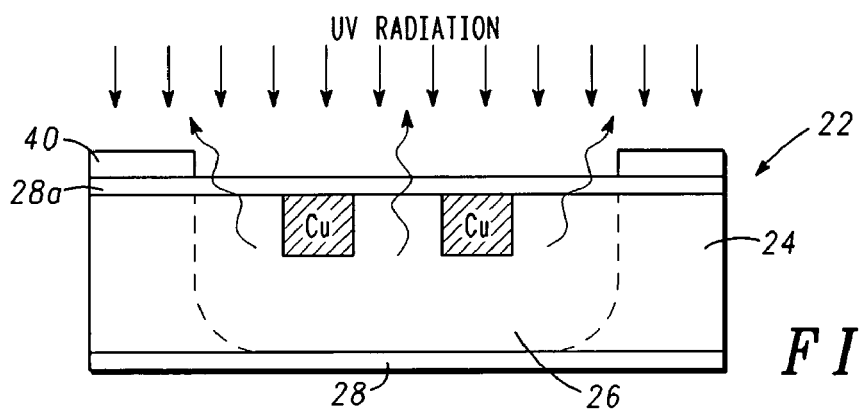
FIG. 5 illustrates a method of selective UV curing of a dielectric layer, according to a second preferred embodiment of the present invention.
Figure 6:
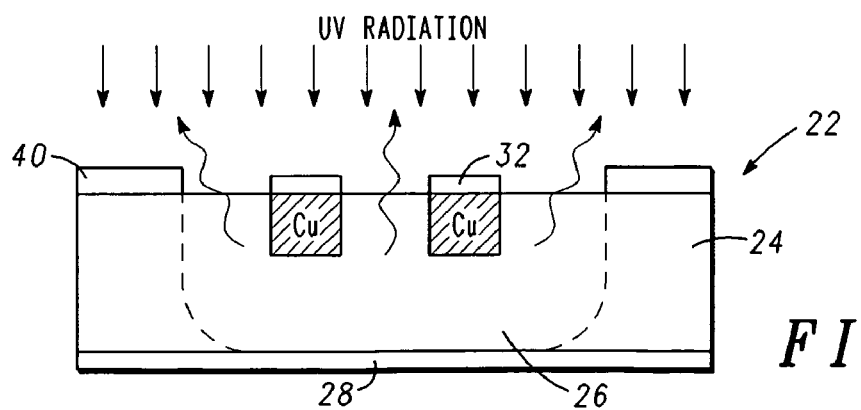
FIG. 6 illustrates a method of selective UV curing of a dielectric layer, according to a variant of the second preferred embodiment of the invention.

A second preferred embodiment of the invention is illustrated in FIG. 5. A variant of the second preferred embodiment is illustrated in FIG. 6. In FIGS. 5 and 6, elements which are substantially the same as those shown in FIG. 4 are indicated using the same reference numerals as in FIG. 4.

In this second preferred embodiment, a hardmask 40 that is opaque to the irradiating wavelength is used to select which regions of a dielectric layer 22 will be irradiated. For example, a TiN hardmask could be used when irradiating the dielectric material using UV radiation of wavelength 365 nm.

As illustrated in FIG. 5, before the hardmask 40 is deposited, copper lines present at the surface of the wafer are passivated by depositing a passivation layer 28a (e.g. SiCN, SiC, SiN, etc.). The hardmask 40 is then deposited and patterned using any convenient technique (e.g. conventional methods). Once again, in the example illustrated in FIG. 5, the hardmask 40 is patterned so that a selected region 26 of the dielectric layer 22 is exposed to ultraviolet radiation and a remaining region 24 is shielded from the UV radiation, so that porogens are expelled only from the selected region 26 of the dielectric layer 22. Once again, the whole wafer is heated during the selective UV curing step. After selective UV curing the hardmask 40 is stripped from the wafer using any convenient technique (e.g. conventional methods).

In the method according to the second preferred embodiment, it is preferable to choose for the passivation layer 28a a material which is permeable to the porogens that are expelled from the selected region 26, for example, nitrides in which the density is reduced to allow outgassing of small porogen molecules.

However, in the variant of the second preferred embodiment illustrated in FIG. 6, the copper lines are protected, not by a passivation layer 28a, but by localised capping using a capping material 32. The capping material can be any suitable substance, for example CoWP, CoWB, etc., and it is typically deposited using a selective electroless deposition process.

Figure 7:
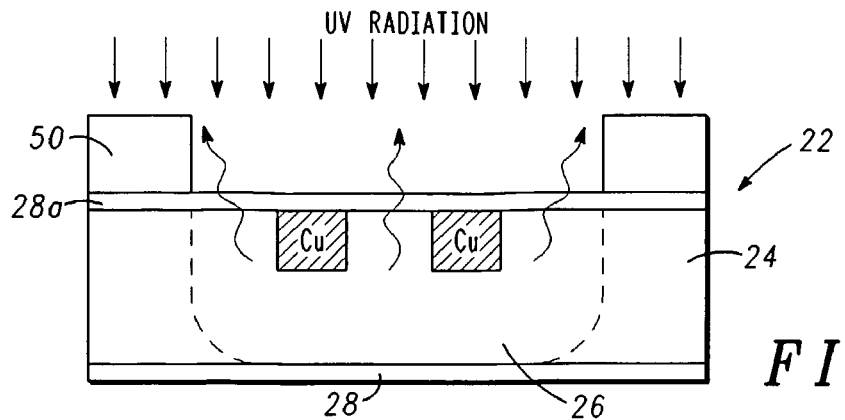
FIG. 7 illustrates a method of selective UV curing of a dielectric layer, according to a third preferred embodiment of the present invention.
Figure 8:
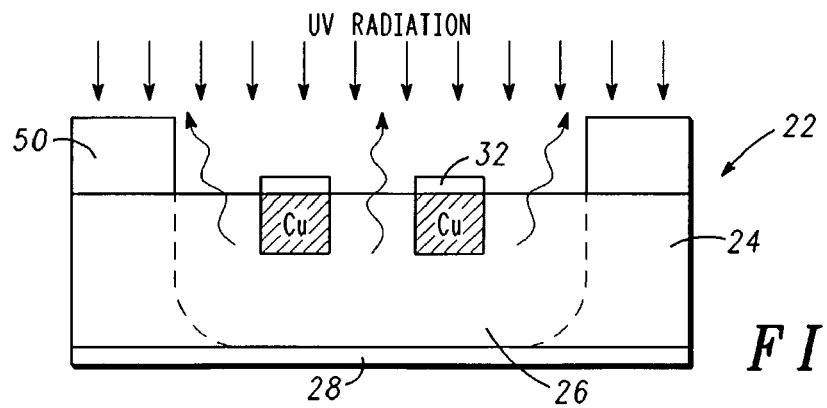
FIG. 8 illustrates a method of selective UV curing of a dielectric layer, according to variant of the third preferred embodiment of the present invention.

A third preferred embodiment of the invention is illustrated in FIG. 7. A variant of the third preferred embodiment is illustrated in FIG. 8. In FIGS. 7 and 8, elements which are substantially the same as those shown in FIGS. 4 to 6 are indicated using the same reference numerals as in FIGS. 4 to 6.

In this third preferred embodiment, a resist 50 that is substantially opaque to the irradiating wavelength is used to select which regions of a dielectric layer 22 will be irradiated. At the irradiating wavelength(s), the resist 50 should be sufficiently opaque that even if it allows some light through to reach the dielectric layer this is insufficient to cause expulsion of the porogen. For example, in the case where i-line radiation ($\lambda \sim 365$ nm) is used for the selective exposure, a conventional dyed-novolak resin i-line resist (such as JSR 725 or Shipley SPR500) could be used as the resist 50.

As illustrated in FIG. 7, before the resist 50 is deposited, copper lines present at the surface of the wafer are passivated by depositing a passivation layer 28a (e.g. SiCN, SiC, SiN, etc.). The resist 50 is then deposited and patterned using any convenient technique (e.g. conventional photolithography methods). Once again, in the example illustrated in FIG. 7 the patterning of the opaque resist is such that the selected region 26 of the dielectric layer 22 is UV cured but the remaining region 24 is not, and the whole wafer is heated during the selective UV curing step. After selective UV curing the opaque resist 50 is stripped from the wafer using any convenient technique (e.g. conventional methods).

As in the second preferred embodiment, also in the third preferred embodiment it is preferable to choose for the passivation layer 28a a material which is permeable to the porogens that are expelled from the selected region 26. Alternatively, as shown in FIG. 8, in the variant of the third preferred embodiment, the copper lines are selectively capped rather than providing the passivation layer 28a.

In the above description of the first to third preferred embodiments of the invention, for simplicity, no consideration has been given to the possible effects of the selective UV irradiation on underlying layers beneath the dielectric layer that it is desired to selectively cure. However, in practice, the preferred embodiments do take into account such potential effects, as explained below.

When UV radiation is applied to the dielectric layer which it is desired to selectively cure, it is possible for the UV radiation to penetrate to underlying layers. If UV radiation penetrates to an underlying layer which still contains a porogen, e.g. because of selective UV curing of this underlying layer, then the porogen can cause undesirable bubbles as it tries to escape. The preferred embodiments of the invention make use of one of the following two approaches for avoiding this problem:

physically prevent penetration of UV radiation to underlying layers (e.g. by using a passivation layer 28 which absorbs UV radiation and/or a dielectric material which is UV-absorbing even when treated so as to have low dielectric constant); or ensure that penetration of UV radiation to underlying layers only reaches regions which lack porogen, notably by ensuring that the layouts of the masks used for selective UV cure are designed such that all of the irradiated regions overlap (i.e. such that the irradiated region of an upper layer does not extend beyond the irradiated regions of underlying layers). This approach is particularly simple to implement in a case such as that illustrated in FIG. 3, where everything except the input/output terminal region is to be irradiated.

The first aspect of the invention is not limited with respect to the type of material that can be used for forming the dielectric layer except insofar as that material will be one which has lower mechanical strength after being subjected to processing to lower the dielectric constant thereof. The skilled person can readily determine for a given material whether or not the mechanical strength of that material has reduced after treatment to reduce its dielectric constant. However, as a further example, doped organo-silicate glasses could be mentioned (e.g. fluorine-doped organo-silicate glasses). It should be noted that, for certain porogen-containing dielectric materials, the porogen loading affects the change in mechanical strength that is observed during UV curing (in other words, for a given dielectric material it may be observed that, at a first porogen loading, the material becomes weaker during UV cure whereas, at a different porogen loading, the same material may become stronger during UV cure).

The present invention renders the mechanical strength of a low-k dielectric layer sufficient to withstand CMP and packaging processes. According to the first aspect of the invention this is achieved by selective processing aimed at reducing the dielectric constant only of certain regions of the dielectric layer. However, the present invention is not limited to this technique.

According to a second aspect of the invention, the mechanical strength of a low-k dielectric layer is enhanced by selective processing which strengthens certain non-critical regions of the low-k dielectric layer. A fourth preferred embodiment, according to this second aspect of the invention, will now be described with reference to FIG. 9.

Figure 9A:
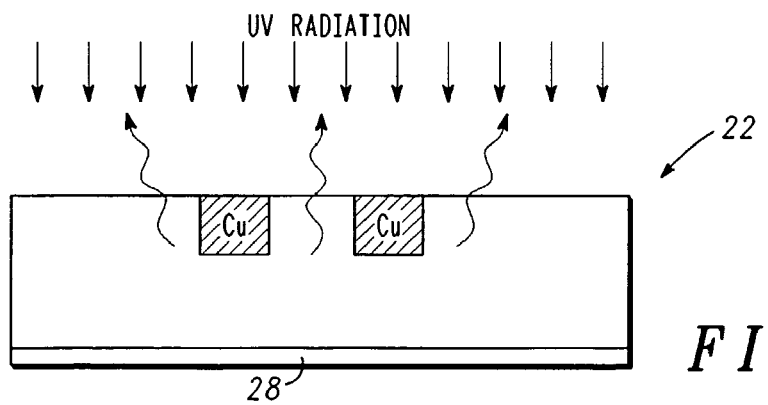
FIGS. 9A and 9B illustrate respective different stages in the method.

In this fourth preferred embodiment of the invention, a layer of dielectric material 22 is formed on a passivation layer 28 on a wafer (not shown). Then, in a first step, the whole dielectric layer 22 is treated so as to lower the dielectric constant thereof, for example by blanket application of ultraviolet radiation (as shown in FIG. 9A). Because of this initial blanket exposure of the dielectric layer 22 to UV radiation, a porogen present in the dielectric layer 22 is driven off, lowering the dielectric constant of the whole layer. Standard process conditions can be used for expelling the porogen.

Next, the mechanical properties of one or more selected, non-critical regions of the dielectric layer 22 are modified during a second step, so as to increase mechanical strength. For simplicity, once again it will be assumed that the selected non-critical region corresponds to the region 24 shown in FIG. 3, whereas the remaining region (where low-k properties are important) is the region 26.

Figure 9B:
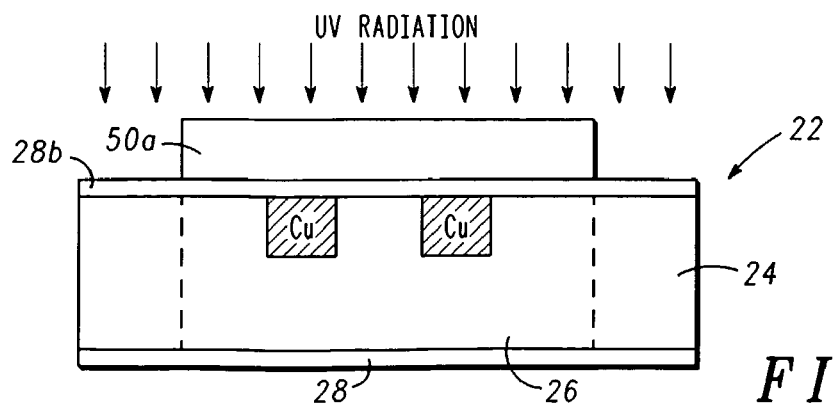

One technique that is suitable for increasing the mechanical strength of certain typical dielectric materials is to over-cure them (this increases cross-linking within the dielectric material). So, according to the fourth preferred embodiment of the invention, the selected non-critical region or regions 24 of the dielectric layer are subjected to a second exposure to ultraviolet radiation. This second exposure is similar to the first but has a duration suitable to over-cure the dielectric layer. As shown in FIG. 9B, the selected non-critical region(s) 24 can be selectively exposed to ultraviolet radiation by using an opaque resist 50a to screen off the other regions 26 of the dielectric layer 22. Before the opaque resist 50a is deposited, it is preferred to form a passivation layer 28b (e.g. nitride) on the surface of the dielectric layer 22.

The selective-exposure technique of FIG. 9B mirrors that used in the third preferred embodiment of the invention. However, the second aspect of the invention is not limited to use of an opaque resist for achieving the desired selective exposure of the dielectric layer; a photo-mask or hardmask could be used to define the regions to be exposed, as in the first and second preferred embodiments of the invention.

Moreover, although the fourth preferred embodiment of the invention involves a first step to reduce the dielectric constant of a deposited dielectric layer, followed by a second step to increase the mechanical strength of selected non-critical regions thereof, the second aspect of the invention is not limited to a two-step process. More particularly, for certain low-k dielectric materials (e.g. low-k dielectric materials which do not contain a porogen), it may only be necessary to perform the second step, that is a treatment to increase the strength of the selected non-critical region(s). In this case, selective UV curing or electron-beam irradiation will be a suitable strengthening treatment for various low-k dielectric materials.

It should be mentioned that the above-described treatments for increasing the mechanical strength of certain non-critical portions of a low-k dielectric layer will tend to increase the dielectric constant of the strengthened region(s). However, because the regions selected for strengthening correspond to non-critical portions of the IC device, this increase in dielectric constant is acceptable.

Moreover, it will be realized that the above-described one-step process according to the second aspect of the invention (in which a low-k dielectric material layer is formed and then treated to selectively increase the mechanical strength of non-critical regions thereof) amounts to the inverse of the process according to the first aspect of the present invention (in which a dielectric material layer is formed and then treated to selectively decrease the dielectric constant of selected regions thereof which include critical regions). Both techniques are covered by the present invention.

An advantage provided by the preferred embodiments of the invention is that they enable wafers comprising low-k dielectric layers to be processed using substantially conventional equipment and processes. More especially, the wafer is rendered sufficiently robust to withstand conventional packaging and CMP process steps. Furthermore, although the above-described selective UV curing processes require performance of a number of steps (such as mask formation and stripping) for each metal layer of the integrated circuit device, these steps can be performed using modified versions of known tools. For example, the selective UV curing step illustrated in FIG. 4 can be performed using a modified stepper (having a heated chuck and adapted to cope with the outgassing of the porogen).

Although the present invention has been described above with reference to certain particular preferred embodiments, it is to be understood that the invention is not limited by reference to the specific details of those preferred embodiments. More specifically, the person skilled in the art will readily appreciate that modifications and developments can be made in the preferred embodiments without departing from the scope of the invention as defined in the accompanying claims.

For example, although the above description of the preferred embodiments of the invention refers to the use of i-line radiation in a selective UV-curing process, it is to be understood that the present invention is not limited to the use of radiation at this wavelength. Moreover, the applied radiation need not be monochromatic; broadband radiation could be applied.

Furthermore, the above-described preferred embodiments use selective UV-curing to reduce the dielectric constant of selected portions of a dielectric layer and/or to increase mechanical strength. However, it is to be understood that other techniques could be used for reducing the dielectric constant of the selected portions and/or increase mechanical strength of non-critical portions. In particular, selective electron-beam irradiation could be used (even though this is slower), or a plasma-assisted curing process (in embodiments using a hardmask).

The invention claimed is:

1. A method of fabricating an integrated circuit device on a semiconductor wafer, comprising:
    forming on the wafer a dielectric layer having a first value of dielectric constant;
    forming a metal line in a trench region formed within the dielectric layer;
    capping the metal line;
    producing first and second regions in said dielectric layer after capping the metal line by masking an area of the dielectric layer corresponding to said first region with a hard mask pattern and applying radiation to said area of the dielectric layer corresponding to said second region, to cause the dielectric constant of the dielectric material layer to reduce, wherein the hard mask pattern is substantially opaque to the radiation; and
    wherein the first region retaining said first value of dielectric constant, the second region including the trench region and having a second value of dielectric constant, said second value being lower than said first value and lower than 3.0, wherein the mechanical strength of said first region is greater than the mechanical strength of the second region, and wherein said producing comprises treating an area of the dielectric layer corresponding to said second region to lower the dielectric constant thereof to said second value.

2. The integrated circuit device fabrication method of claim 1, wherein forming the dielectric layer comprises forming a dielectric layer comprising pores containing a porogen, and the treating comprises expelling porogen from the pores in said second region.

3. The integrated circuit device fabrication method of claim 1, wherein applying radiation comprises:
    applying ultraviolet radiation to said area of the dielectric layer corresponding to said second region.

4. The integrated circuit device fabrication method of claim 1, wherein applying radiation comprises:
    applying an electron beam to said area of the dielectric layer corresponding to said second region.

5. The integrated circuit device fabrication method of claim 1, wherein each second region is defined at a location on the wafer which is not to be overlaid by a bond pad.

6. The integrated circuit device fabrication method of claim 1, and comprising forming a passivation layer on the dielectric layer, said passivation-layer formation being performed before said masking.

7. The integrated circuit device fabrication method of claim 1, and comprising heating the wafer during applying radiation.

8. A method of fabricating an integrated circuit device on a semiconductor wafer, comprising:
    forming on the wafer a dielectric layer having a first value of dielectric constant;
    forming a metal line in a trench region formed within the dielectric layer;
    capping the metal line;
    producing first and second regions in said dielectric layer after capping the metal line by masking an area of the dielectric layer corresponding to said first region with a resist patterned to shield said area of the dielectric layer corresponding to said first region of the dielectric layer from applied radiation, said resist being substantially opaque to said applied radiation, and applying radiation to said area of the dielectric layer corresponding to said second region, to cause the dielectric constant of the dielectric material layer to reduce, and
    wherein the first region retaining said first value of dielectric constant, the second region including the trench region and having a second value of dielectric constant, said second value being lower than said first value and lower than 3.0, wherein the mechanical strength of said first region is greater than the mechanical strength of the second region; wherein said producing comprises treating an area of the dielectric layer corresponding to said second region to lower the dielectric constant thereof to said second value.

* * * * *